(12) United States Patent
Li et al.

(10) Patent No.: US 10,141,541 B1
(45) Date of Patent: Nov. 27, 2018

(54) PACKAGE COMPONENT OF AN OLED DEVICE AND A PACKAGE METHOD THEREOF, AND A DISPLAY DEVICE

(71) Applicant: Shenzhen China Star Optoelectronics Technology Co., Ltd., Shenzhen, Guangdong (CN)

(72) Inventors: Wenjie Li, Guangdong (CN); Ting Shi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/541,538

(22) PCT Filed: Jun. 23, 2017

(86) PCT No.: PCT/CN2017/089704
§ 371 (c)(1),
(2) Date: Jul. 5, 2017

(30) Foreign Application Priority Data

May 25, 2017 (CN) .......................... 2017 1 0379285

(51) Int. Cl.
*H01L 51/52* (2006.01)
*H01L 51/56* (2006.01)

(52) U.S. Cl.
CPC ........ *H01L 51/5253* (2013.01); *H01L 51/529* (2013.01); *H01L 51/56* (2013.01); *H01L 2251/5338* (2013.01)

(58) Field of Classification Search
CPC ... H01L 51/52; H01L 51/529; H01L 51/5253; H01L 51/56; H01L 2251/5338
See application file for complete search history.

(56) References Cited

U.S. PATENT DOCUMENTS

| | | | | |
|---|---|---|---|---|
| 9,607,824 | B2 * | 3/2017 | Tanaka | H01L 21/02172 |
| 9,608,234 | B2 * | 3/2017 | Kim | H01L 51/5256 |
| 2012/0056234 | A1 * | 3/2012 | Lee | B23K 35/26 257/99 |
| 2014/0332763 | A1 | 11/2014 | Kim | |
| 2017/0040392 | A1 | 2/2017 | Wang et al. | |
| 2017/0040572 | A1 * | 2/2017 | Gao | H01L 51/0021 |
| 2017/0155082 | A1 * | 6/2017 | Mu | H01L 51/5253 |
| 2017/0170245 | A1 * | 6/2017 | Lin | H01L 27/3246 |
| 2017/0194595 | A1 * | 7/2017 | Li | H01L 51/529 |

FOREIGN PATENT DOCUMENTS

| | | |
|---|---|---|
| CN | 105118927 A | 12/2015 |
| CN | 105449121 A | 3/2016 |
| CN | 105552246 A | 5/2016 |
| CN | 106384743 A | 2/2017 |
| CN | 106450029 A | 2/2017 |

\* cited by examiner

*Primary Examiner* — Phuc Dang
(74) *Attorney, Agent, or Firm* — Andrew C. Cheng

(57) ABSTRACT

The present invention provides a package component of an Organic Light Emitting Diode (OLED) device and a package method thereof, and a display device. A first blocking layer covers the OLED device. A side of the first blocking layer far away from the OLED device includes a first pattern region and a second pattern region alternately set along a predetermined direction, and thickness of the first blocking layer at the first pattern region is smaller than that at the second pattern region.

13 Claims, 3 Drawing Sheets

PACKAGE COMPONENT OF AN OLED DEVICE AND A PACKAGE METHOD THEREOF, AND A DISPLAY DEVICE

BACKGROUND

Technical Field

The present invention relates to display field, and more particularly, to a package component of an Organic Light Emitting Diode (OLED) device and a package method thereof, and a display device.

Description of Related Art

Organic Light Emitting Diode (OLED) is a new display device and difference between a conventional liquid crystal display (LCD) and it is that OLED does not need a backlight source. An organic thin film is formed on a substrate and between cathode metal and anode metal. Forward voltage is applied to the two electrodes and the organic thin film emits light. Organic material of the organic thin film is sensitive to water vapor and oxygen so infiltrate of water and oxygen can reduce lifetime of the OLED device. For achieving requirement of lifetime and stabilization in market, quality of packaging OLED device is very high.

A conventional method adopts thin film packaging to package the OLED device. Referring FIG. 1, a package thin film 12 is formed on the OLED device 11 and covers it. The package thin film 12 is formed by alternately depositing a blocking layer 121 and a buffer layer 122. The blocking layer 121 is effective blocking layer for oxygen and water. The main composition of the blocking layer 121 is inorganic material. Defect such as pinholes and particles can appear in the manufacturing process. The main composition of the buffer layer 122 is organic material to cover the defects of the blocking layer 121 and be flat. The stronger the ability blocking oxygen and water is, the thicker the blocking layer 121 is. The bigger the stress of the OLED device 11 is when bending, the easier peeling of the thin film 12 form the OLED device 11 is. For improving the utilizing efficiency of material and saving cost, the conventional method adopts Ink-jet printing (IJP) to form the buffer layer 122. How to prevent leakage of the buffer layer 122 is very important. In addition, the design of the OLED device becomes thin so the wiring is closer and how to improving heat dissipating of the OLED device is very important as well.

SUMMARY

The present invention provides a package component of an Organic Light Emitting Diode (OLED) device and a package method thereof, and a display device to avoid package thin film peeling because the OLED device is bending and to prevent drop leakage of adopting Ink-jet printing (IJP) to form package thin film. It can improve heat dissipation of the OLED device as well.

An embodiment of the present invention provides a package component of an OLED device, including:
  a substrate, loading the OLED device;
  a first blocking layer covering the OLED device, a side of the first blocking layer far away from the OLED device including a first pattern region and a second pattern region alternately set along a predetermined direction, wherein thickness of the first blocking layer at the first pattern region is smaller than that at the second pattern region; and
  a buffer layer coated on the first blocking layer, including heat-dissipating particles.

An embodiment of the present invention provides a display device comprising a package component, the package component including:
  a substrate, loading the OLED device;
  a first blocking layer covering the OLED device, a side of the first blocking layer far away from the OLED device including a first pattern region and a second pattern region alternately set along a predetermined direction, wherein thickness of the first blocking layer at the first pattern region is smaller than that at the second pattern region; and
  a buffer layer coated on the first blocking layer, including heat-dissipating particles.

An embodiment of the present invention provides a method of packaging an OLED device, comprising:
  providing a substrate;
  loading the OLED device on the substrate;
  covering the OLED device with a first blocking layer, wherein a side of the first blocking layer far away from the OLED device includes a first pattern region and a second pattern region alternately set along a predetermined direction, and thickness of the first blocking layer at the first pattern region is smaller than that at the second pattern region; and
  coating a buffer layer on the first blocking layer, the buffer layer including heat-dissipating particles.

The benefit of the present invention is that the first blocking layer includes a predetermined pattern so thickness of the first blocking layer at the first pattern region is smaller than that at the second pattern region. It reduces stress applied to the first blocking layer when the OLED device is bending. Moreover, the first pattern region can accommodate drops of forming the buffer layer via IJP to avoid leakage. The heat-dissipating particles in the buffer layer can improve heat dissipation of the OLED device.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure. In the case of no conflict, the following embodiments and the features thereof can be combined with each other.

Figure 2:
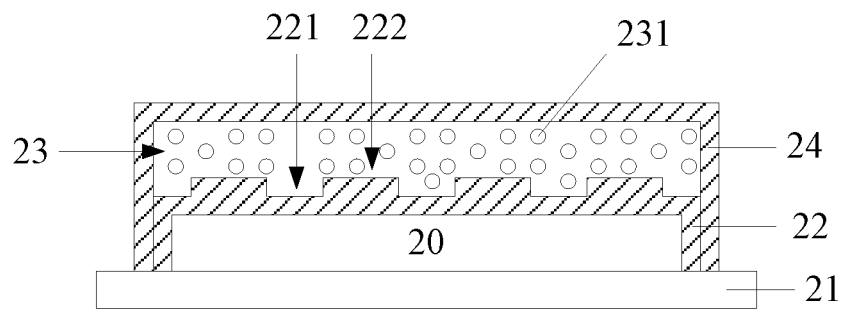
FIG. 2 is a cross-sectional view of a display device in accordance with an embodiment of the present invention.

Referring FIG. 2, FIG. 2 is a cross-sectional view of a display device in accordance with an embodiment of the present invention. The display device includes an Organic Light Emitting Diode (OLED) device 20 and a package component of the OLED device 20. The package component can include substrate 21, a first blocking layer 22, and a buffer layer 23.

The OLED device 20 is on the substrate 21. The substrate 21 includes but is not limited to transparent glass substrate and transparent plastic substrate. For manufacturing flexible display device, the substrate 21 can adopt transparent plastic substrate which is bendable.

Figure 3:
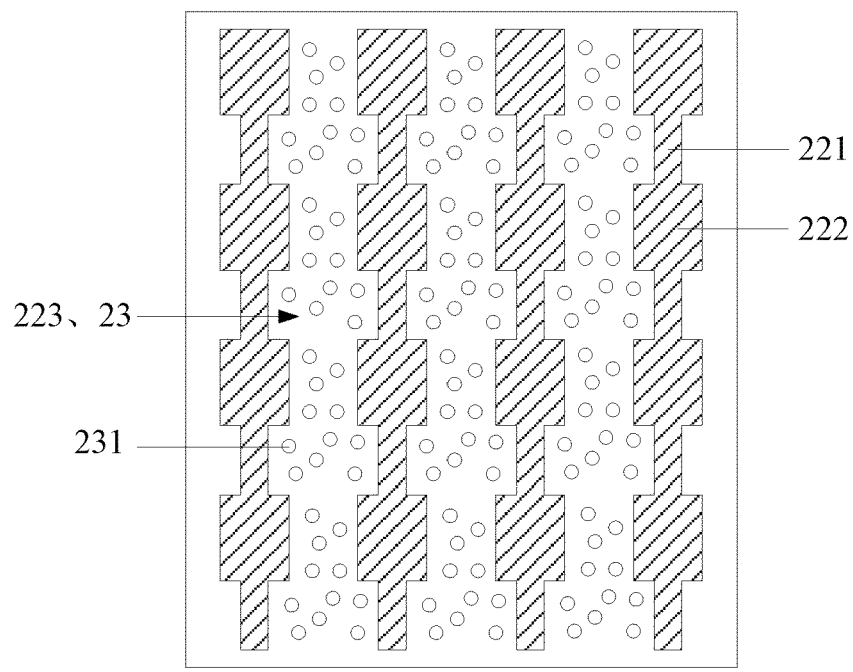
FIG. 3 is a top view of a structure of a buffer layer and a first blocking layer shown in FIG. 2.

The first blocking layer 22 covers the OLED device 20. A side of the first blocking layer 22 far away from the OLED device 20 includes predetermined patterns, as FIG. 3 shown. The first blocking layer 22 can include multiple band areas which are set alternately along a direction horizontal to the substrate 21 (horizontal direction). Each band area includes a first pattern region 221 and a second pattern region 222 alternately set along vertical direction. Thickness of the first blocking layer 22 at the first pattern region 221 is smaller than that at the second pattern region 222. A third pattern region 223 is between two adjacent band areas and can expose a surface of the OLED device 20.

Figure 4:
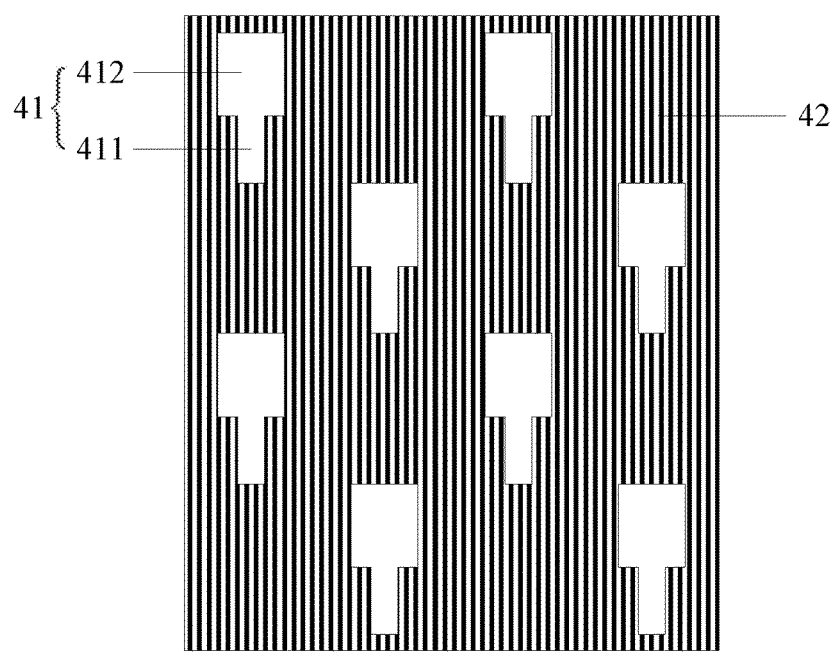
FIG. 4 is a top view of a structure of a mask manufacturing the first blocking layer shown in FIG. 3.

The present invention can adopt Plasma Enhanced Chemical Vapor Deposition (PECVD) to form the first blocking layer 22. Specifically, the substrate 21 on which the OLED device 20 is located is set in a sealing chamber, and a mask 40 is set on the OLED device 20. As shown in FIG. 4, the mask 40 includes a hollow region 41 and an non-hollow region 42. The hollow region 41 includes a first subregion 411 and a second subregion 412 which are connected with each other, and area of the first subregion 411 is less than that of the second subregion 412. The shapes of the first subregion 411 and the second subregion 412 can be rectangle. The shapes of the first subregion 411 and the second subregion 412 can be the same in top view. Reacting gas is passed into the sealing chamber. For instance, a mixing gas has $SiH_4$, $NH_3$, and $N_2$. RF discharge is applied to the reacting gas so $SiN_x$ is generated by the reaction. $SiN_x$ passes the hollow region 41 of the mask 40 and is deposited on the OLED device 20 to form the first blocking layer 22.

When number of the hollow region 41 of the mask 40 is less than that of the first pattern region 221 or the second pattern region 222, the mask 40 can be moved horizontally to a predetermined region and PECVD is performed again after one PECVD process. Distance and times of movement are determined according to design pattern and number of the first pattern region 221 and the second pattern region 222 of the first blocking layer 22. Thus, the first blocking layer 22 including the predetermined pattern is formed.

The present invention can adopt one of Atomic Layer Deposition (ALD), Physical Vapor Deposition (PVD), and Chemical Vapor Deposition (CVD), and collaborate with the mask 40 to form the first blocking layer 22 having the predetermined pattern.

Material of the first blocking layer 22 can be other inorganic material such as aluminum nitride, aluminum oxide, aluminum nitrogen oxide, silicon oxide, or silicon nitrogen oxide.

Referring to FIGS. 2 and 3, the buffer layer 23 is coated on the first blocking layer 22 and can fully cover the first pattern region 221, the second pattern region 222, and the third pattern region 223. That is, the buffer layer 23 can fully cover an entire structure of the first blocking layer 22. In another embodiment of the present invention, the buffer layer 23 can merely cover the first pattern region 221 and the third pattern region 223. In addition, the buffer layer 23 is doped with heat-dissipating particles 231.

Material of the buffer layer 23 can be organic material such as epoxy, silicon polymer, or PMMA. Material of the heat-dissipating particles 231 can be material of high thermal conductivity coefficient such as graphene, Carbon Nanotube, $Al_2O_3$, MgO, ZnO, AlN, BN. It can also be Ag, Cu, Au, and alloy thereof.

The present invention can form the buffer layer 23 without the mask. It can adopt one of One Drop Filling (ODF), JIP and Nozzle Printing to form the buffer layer 23 and save cost of mask design and production, for example. Cost of production and manufacturing entire package component can be reduced as well.

ODF, for example, provides hydrophilic modification to nano $Al_2O_3$ particles and uniformly disperses the $Al_2O_3$ particles in epoxy via high shear dispersing emulsifier. The doping amount of the $Al_2O_3$ particles can be 3~50 wt % and viscosity of the buffer solution is less than 0.5 Pa·s. The buffer solution is cured in 80~100° C. to form the buffer layer 23. The present invention also can adopt UV curing to form the buffer layer 23.

In the present invention, the first blocking layer 22 is effective blocking layer for water and oxygen. The buffer layer 23 can cover the first blocking layer 22 and perform flattening. The buffer layer 23 and the first blocking layer 22 can be deemed as package thin film of the OLED device 20. Compared to the conventional art, thickness of the first blocking layer 22 at the first pattern region 221 is smaller than that at the second pattern region 222 in the present invention. Namely, a side of the first blocking layer 22 far away from the OLED device 20 is patterned. The edges of the first pattern region 221 and the second pattern region 222 cannot be squeezed when the OLED device 20 is bending, and stress of the first blocking layer 22 is reduced. Thus it can avoid that the package thin film is peeled when the OLED device 20 is bending. Moreover, the first pattern region 221 can accommodate drops of forming the buffer layer 23 via UP to avoid leakage. The heat-dissipating particles 231 in the buffer layer 23 can improve heat dissipation of the OLED device 20. Furthermore, adding the heat-dissipating particles 231 into the buffer layer 23 can extend route of water and oxygen entering the OLED device 20 and improve the resistibility of water and oxygen.

Furthermore, the present can adopt heat-dissipating material of high light transmittance to form the heat-dissipating particles 231 and ensure the light-output performance.

Figure 1:
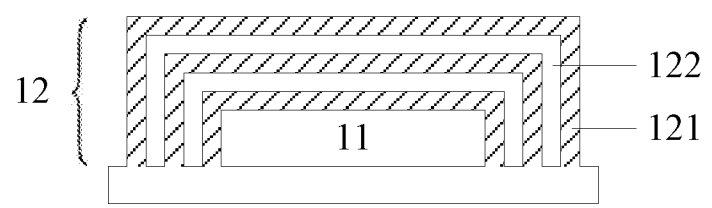
FIG. 1 is a cross-sectional view of a package component of a conventional OLED device.

Referring FIG. 1, the package component can further include a second blocking layer 24 covering the buffer layer 23 and the first blocking layer 22 in accordance with an embodiment of the present invention. Material of the second blocking layer 24 can be the same as that of the first blocking layer 22. The present invention can form the second blocking layer 24 without the mask. A method of forming the second blocking layer 24 can adopt one of ODF, Nozzle Imprinting, and Nozzle Printing to save cost, for example.

A surface of the second blocking layer 24 far away from the buffer layer 23 can be a flat plane. A protective film or a touch sensor film of touch sensor function is attached to the flat plane. There is no small gully at the attaching part of the flat plane and the protective film or the touch sensor film to avoid bubble when the OLED device 20 displays.

Figure 5:
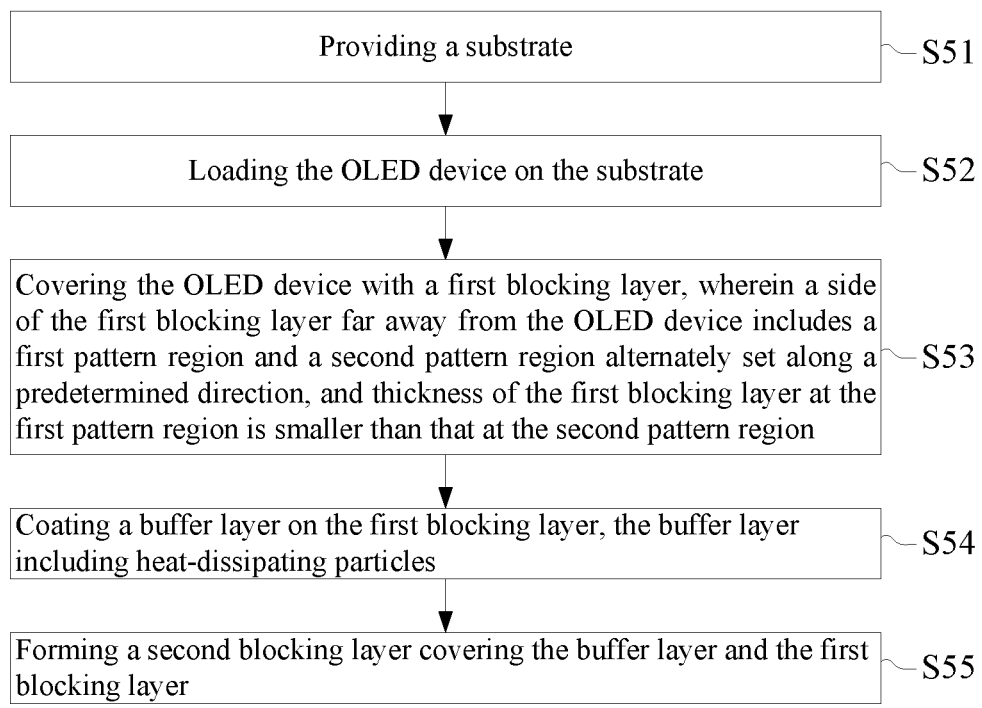
FIG. 5 is a flow chart of manufacturing an OLED device in accordance with an embodiment of the present invention.

Referring FIG. 5, FIG. 5 is a flow chart of packaging an OLED device in accordance with an embodiment of the present invention. The packaging method can include the following steps S51~S54.

S51, providing a substrate.

The substrate includes but is not limited to transparent glass substrate and transparent plastic substrate. For manufacturing flexible OLED display device, the substrate can adopt transparent plastic substrate which is bendable.

S52, loading the OLED device on the substrate.

S53, covering the OLED device with a first blocking layer. A side of the first blocking layer far away from the OLED device includes a first pattern region and a second pattern region alternately set along a predetermined direction. Thickness of the first blocking layer at the first pattern region is smaller than that at the second pattern region.

The side of the first blocking layer far away from the OLED device includes predetermined patterns. The first blocking layer can include multiple band areas which are set alternately along a direction horizontal to the substrate (horizontal direction). Each band area includes the first pattern region and the second pattern region alternately set along vertical direction. Thickness of the first blocking layer at the first pattern region is smaller than that at the second pattern region. A third pattern region is between two adjacent band areas and can expose a surface of the OLED device.

The present invention can adopt PECVD to form the first blocking layer. First, the substrate loading the OLED device is set in a sealing chamber, and a mask is located on the OLED device. The mask includes a hollow region and an non-hollow region. The hollow region includes a first subregion and a second subregion connected thereto, and area of the first subregion is less than that of the second subregion. The shapes of the first subregion and the second subregion can be rectangle. The shapes of the first subregion and the second subregion can be the same in top view. Reacting gas is passed into the sealing chamber. For instance, a mixing gas has $SiH_4$, $NH_3$, and $N_2$. RF discharge is applied to the reacting gas so $SiN_x$ is generated by the reaction. $SiN_x$ passes the hollow region of the mask and is deposited on the OLED device to form the first blocking layer.

When number of the hollow region of the mask is less than that of the first pattern region or the second pattern region, the mask can be moved horizontally to a predetermined region and PECVD is performed again after one PECVD process. Distance and times of movement is determined according to designed pattern and number of the first pattern region and the second pattern region of the first blocking layer. Thus, the first blocking layer including the predetermined pattern is formed.

The present invention can adopt one of ALD, PVD, and CVD, and collaborate with the mask to form the first blocking layer 22 having the predetermined pattern.

Material of the first blocking layer can be other inorganic material such as aluminum nitride, aluminum oxide, aluminum nitrogen oxide, silicon oxide, or silicon nitrogen oxide.

S54, covering the first blocking layer with a buffer layer. The buffer layer is doped with heat-dissipating particles.

The buffer layer can fully cover the first pattern region, the second pattern region, and the third pattern region. That is, the buffer layer can fully cover an entire structure of the first blocking layer. In another embodiment of the present invention, the buffer layer can merely cover the first pattern region and the third pattern region. In addition, the buffer layer is doped with the heat-dissipating particles. Furthermore, the present can adopt heat-dissipating material of high light transmittance to form the heat-dissipating particles and ensure the light-output performance.

Material of the buffer layer can be organic material such as epoxy, silicon polymer, or PMMA. Material of the heat-dissipating particles can be material of high thermal conductivity coefficient such as graphene, carbon nanotube, $Al_2O_3$, MgO, ZnO, AlN, BN. It can also be Ag, Cu, Au, and alloy thereof.

The present invention can form the buffer layer without the mask. It can adopt one of ODF, Ink-jet printing (IJP), and Nozzle Printing to form the buffer layer and save cost of mask design and production. Cost of production and manufacturing entire package component can be reduced as well.

ODF, for example, provides hydrophilic modification to nano $Al_2O_3$ particles and uniformly disperses the $Al_2O_3$ particles in epoxy via high shear dispersing emulsifier. The doping amount of the $Al_2O_3$ particles can be 3~50 wt % and viscosity of the buffer solution is less than 0.5 Pa·s. The buffer solution is cured in 80~100° C. to form the buffer layer. The present invention also can adopt UV curing to form the buffer layer.

The present invention can further form a second blocking layer covering the buffer layer and the first blocking layer. That is, the packaging method can further includes step S55.

S55, forming a second blocking layer covering the buffer layer and the first blocking layer.

A surface of the second blocking layer far away from the buffer layer can be a flat plane. Material of the second blocking layer can be the same as that of the first blocking layer. The present invention can form the second blocking layer without the mask. It can adopt one of ODF, Ink-jet printing (IJP), and Nozzle Printing to form the buffer layer and save cost, for example.

The method of packaging the OLED device above can be adopted to manufacture the package component shown in FIG. 2.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A package component of an Organic Light Emitting Diode (OLED) device, comprising:
   a substrate, loading the OLED device;
   a first blocking layer covering the OLED device, a first side of the first blocking layer far away from the OLED device comprising a first pattern region and a second pattern region alternately set along a predetermined direction, a second side of the first blocking layer is flat, and the second side is contacted with the OLED device, wherein thickness of the first blocking layer at the first pattern region is smaller than that at the second pattern region; and
   a buffer layer coated on the first blocking layer, comprising heat-dissipating particles.

2. The package component of claim 1, further comprising a second blocking layer covering the buffer layer and the first blocking layer.

3. The package component of claim 2, wherein a surface of the second blocking layer far away from the buffer layer is a flat plane.

4. The package component of claim 1, wherein a material of the heat-dissipating particles is heat-dissipating material of light transmittance.

5. A display device comprising a package component, the package component comprising:
   a substrate, loading the OLED device;

a first blocking layer covering the OLED device, a first side of the first blocking layer far away from the OLED device comprising a first pattern region and a second pattern region alternately set along a predetermined direction, a second side of the first blocking layer is flat, and the second side is contacted with the OLED device, wherein thickness of the first blocking layer at the first pattern region is smaller than that at the second pattern region; and a buffer layer coated on the first blocking layer, comprising heat-dissipating particles.

6. The package component of claim 5, further comprising a second blocking layer covering the buffer layer and the first blocking layer.

7. The package component of claim 6, wherein a surface of the second blocking layer far away from the buffer layer is a flat plane.

8. The package component of claim 5, wherein a material of the heat-dissipating particles is heat-dissipating material of light transmittance.

9. A method of packaging an OLED device, comprising steps of:

providing a substrate;

loading the OLED device on the substrate;

covering the OLED device with a first blocking layer, wherein a first side of the first blocking layer far away from the OLED device comprises a first pattern region and a second pattern region alternately set along a predetermined direction, a second side of the first blocking layer is flat, the second side is contacted with the OLED device, and thickness of the first blocking layer at the first pattern region is smaller than that at the second pattern region; and coating a buffer layer on the first blocking layer, the buffer layer comprising heat-dissipating particles.

10. The method of claim 9, after coating the buffer layer on the first blocking layer, further comprising forming a second blocking layer covering the buffer layer and the first blocking layer.

11. The method of claim 10, wherein a surface of the second blocking layer far away from the buffer layer is a flat plane.

12. The method of claim 9, wherein a heat-dissipating material of light transmittance is adopted to form the heat-dissipating particles.

13. The method of claim 9, wherein the first blocking layer is formed by patterning with a mask.

\* \* \* \* \*